(12) United States Patent
Cheng et al.

(10) Patent No.: US 9,583,492 B2
(45) Date of Patent: Feb. 28, 2017

(54) STRUCTURE AND METHOD FOR ADVANCED BULK FIN ISOLATION

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Mount Kisco, NY (US); Alexander Reznicek, Troy, NY (US); Kern Rim, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/069,557

(22) Filed: Mar. 14, 2016

(65) Prior Publication Data

US 2016/0197077 A1    Jul. 7, 2016

Related U.S. Application Data

(63) Continuation of application No. 14/495,342, filed on Sep. 24, 2014, now Pat. No. 9,229,618.

(51) Int. Cl.

| | |
|---|---|
| *H01L 27/092* | (2006.01) |
| *H01L 21/8238* | (2006.01) |
| *H01L 21/02* | (2006.01) |
| *H01L 29/10* | (2006.01) |
| *H01L 21/308* | (2006.01) |
| *H01L 29/165* | (2006.01) |

(52) U.S. Cl.
CPC .... *H01L 27/0924* (2013.01); *H01L 21/02381* (2013.01); *H01L 21/02532* (2013.01); *H01L 21/3081* (2013.01); *H01L 21/823807* (2013.01); *H01L 21/823821* (2013.01); *H01L 29/1083* (2013.01); *H01L 29/165* (2013.01)

(58) Field of Classification Search
CPC ............ H01L 29/66795; H01L 29/785; H01L 29/78645; H01L 29/66772; H01L 29/78648

See application file for complete search history.

(56) References Cited

U.S. PATENT DOCUMENTS

| | | | |
|---|---|---|---|
| 7,728,324 B2 | 6/2010 | Tezuka et al. | |
| 8,035,199 B2 | 10/2011 | Izumida et al. | |
| 8,263,462 B2 | 9/2012 | Hung et al. | |
| 8,394,690 B2 | 3/2013 | Ikeda et al. | |

(Continued)

OTHER PUBLICATIONS

Bu, H., "FINFET technology a substrate perspective," 2011 IEEE International SOI Conference (SOI), Oct. 3-6, 2011, slide presentation, 27 pages.

*Primary Examiner* — Quoc Hoang
(74) *Attorney, Agent, or Firm* — Scully, Scott, Murphy & Presser, P.C.; Daniel P. Morris, Esq.

(57) ABSTRACT

A non-planar semiconductor structure containing semiconductor fins that are isolated from an underlying bulk silicon substrate by an epitaxial semiconductor stack is provided. The epitaxial semiconductor material stack that provides the isolation includes, from bottom to top, a semiconductor punch through stop containing at least one dopant of a conductivity type which differs from the conductivity type of the particular device region that the semiconductor fin is formed in, and a semiconductor diffusion barrier layer containing no n- or p-type dopant.

18 Claims, 6 Drawing Sheets

(56) References Cited

U.S. PATENT DOCUMENTS

| | | | |
|---|---|---|---|
| 8,420,459 | B1 | 4/2013 | Cheng et al. |
| 8,450,813 | B2 | 5/2013 | Luo et al. |
| 8,497,171 | B1 * | 7/2013 | Wu .................. H01L 21/82382 |
| | | | 438/199 |
| 8,610,201 | B1 | 12/2013 | Hokazano |
| 9,299,618 | B1 * | 3/2016 | Cheng ................. H01L 27/0924 |
| 2007/0278572 | A1 | 12/2007 | Ban et al. |
| 2011/0147711 | A1 | 6/2011 | Pillarisetty et al. |
| 2011/0169101 | A1 | 7/2011 | Doornbus et al. |
| 2012/0276695 | A1 | 11/2012 | Cheng et al. |
| 2013/0134506 | A1 | 5/2013 | Yagishita |
| 2014/0308781 | A1 | 10/2014 | Basker et al. |
| 2015/0372144 | A1 * | 12/2015 | Fang .................. H01L 29/7851 |
| | | | 257/192 |
| 2016/0197078 | A1 * | 7/2016 | Cheng ................. H01L 27/0924 |
| | | | 257/192 |

* cited by examiner

US 9,583,492 B2

STRUCTURE AND METHOD FOR ADVANCED BULK FIN ISOLATION

BACKGROUND

The present application relates to a semiconductor structure and a method of forming the same. More particularly, the present application relates to a method of forming a non-planar semiconductor structure containing semiconductor fins that are isolated from an underlying bulk silicon substrate by providing a semiconductor diffusion barrier layer and a semiconductor punch through stop layer directly beneath each semiconductor fin.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

10 nm and beyond technology is looking to provide semiconductor fins from a bulk silicon substrate rather than from a semiconductor-on-insulator (SOI) substrate since SOI substrates are more expensive than their bulk semiconductor counterparts. For bulk semiconductor fins, there is a need to isolate the bottommost surface of each semiconductor fin from a remaining portion of the bulk silicon substrate.

SUMMARY

A non-planar semiconductor structure containing semiconductor fins that are isolated from an underlying bulk silicon substrate by an epitaxial semiconductor stack is provided. The epitaxial semiconductor material stack that provides the isolation includes, from bottom to top, a semiconductor punch through stop portion containing at least one dopant of a conductivity type which differs from the conductivity type of the particular device region that the semiconductor fin is formed in, and a semiconductor diffusion barrier layer containing no n- or p-type dopant.

In one aspect of the present application, a method of forming a semiconductor structure is provided. In one embodiment of the present application, the method of the present application includes providing a bulk silicon substrate comprising a device region for a semiconductor device of a first conductivity type. An exposed portion of the bulk silicon substrate in the device region is then recessed to expose a sub-surface of the bulk silicon substrate. A semiconductor material stack of, from bottom to top, a semiconductor punch through stop layer containing at least one dopant of a second conductivity type which is opposite from the first conductivity type, a semiconductor diffusion barrier layer containing no n- or p-type dopant, and an epitaxial semiconductor layer is formed on the sub-surface of the bulk silicon substrate. A plurality of semiconductor fins is then formed in the device region, wherein each semiconductor fin of the plurality of semiconductor fins comprises, from bottom to top, a remaining portion of the semiconductor punch through stop layer, a remaining portion of the semiconductor diffusion barrier layer, and a remaining portion of the epitaxial semiconductor layer.

In another aspect of the present application, a semiconductor structure is provided. In one embodiment of the present application, the semiconductor structure includes a bulk silicon substrate portion comprising a device region for a semiconductor device of a first conductivity type, and a plurality of semiconductor fins in the device region and extending upward from the bulk silicon substrate portion. In accordance with the present application, each semiconductor fin of the plurality of semiconductor fins comprises, from bottom to top, a semiconductor punch through stop portion containing a dopant of the second conductivity type that is opposite from the first conductivity type, a semiconductor diffusion barrier portion containing no n- or p-type dopant, and an epitaxial semiconductor portion.

DETAILED DESCRIPTION

Figure 1:
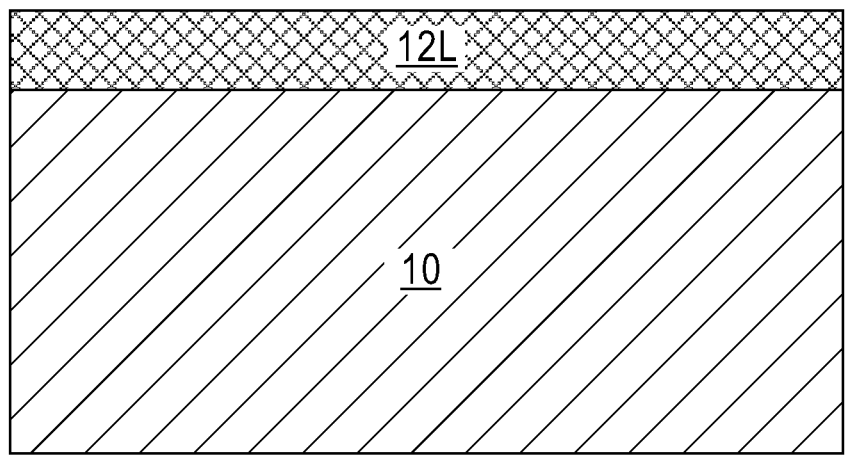
FIG. 1 is a cross sectional view of an exemplary semiconductor structure including, from bottom to top, a bulk silicon substrate and a hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including from bottom to top, a bulk silicon substrate 10 and a hard mask layer 12L that can be employed in accordance with an embodiment of the present application. The term "bulk" as used in conjunction with the phrase "silicon substrate" denotes that the substrate 10 is comprised entirely of silicon. The bulk silicon substrate 10 may be a single crystalline silicon material, a polycrystalline silicon material or an amorphous silicon material. In one embodiment of the present application, the bulk silicon substrate 10 is comprised of single crystalline silicon.

The hard mask layer 12L that is present on a topmost surface of the bulk silicon substrate 10 is a contiguous layer that covers the entirety of the topmost surface of the bulk silicon substrate 10. The hard mask layer 12L that is employed in the present application may include a semiconductor oxide, a semiconductor nitride and/or a semiconductor oxynitride. In one embodiment, the hard mask material that can be used in providing the hard mask layer 12L can be comprised of silicon dioxide. In another embodiment, the hard mask material that can be used in providing the hard mask layer 12L can be comprised of silicon nitride. In yet another embodiment, the hard mask material that can be used in providing the hard mask layer 12L can be a stack comprised of, in any order, silicon dioxide and silicon nitride.

In some embodiments of the present application, the hard mask material that can be used in providing the hard mask layer 12L can be formed by a deposition process such as, for example, chemical vapor deposition (CVD) or plasma enhanced chemical vapor deposition (PECVD). In other embodiments, the hard mask material that can be used in providing the hard mask layer 12L can be formed by a thermal process such as, for example, thermal oxidation and/or thermal nitridation. In yet other embodiments, the hard mask material that can be used in providing the hard mask layer 12L can be formed by a combination of a deposition process and a thermal process. The thickness of the hard mask material that can be used in providing the hard mask layer 12L can range from 2 nm to 10 nm, with a thickness from 3 nm to 6 nm being more typical.

Figure 2:
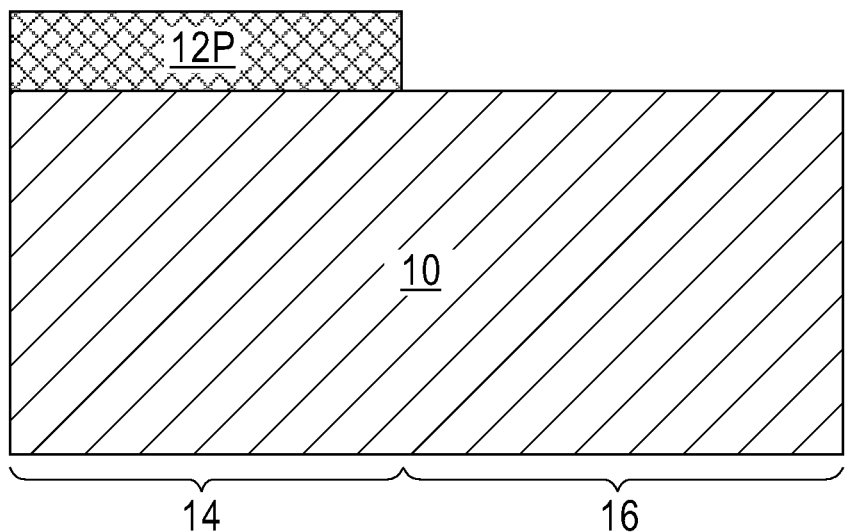
FIG. 2 is a cross sectional view of the exemplary semiconductor structure of FIG. 1 after removing the hard mask layer from a pFET device region of the bulk silicon substrate, while maintaining a hard mask layer portion on an nFET device region of the bulk silicon substrate.

Referring now to FIG. 2, there is illustrated the exemplary semiconductor structure of FIG. 1 after removing the hard mask layer 12L from a pFET device region 16 of the bulk silicon substrate 10, while maintaining a hard mask layer portion 12P on an nFET device region 14 of the bulk silicon substrate 10. The hard mask layer portion 12P constituents a remaining portion of the hard mask layer 12L that was not removed during this step of the present application. The nFET device region 16 is an area in which nFET devices will be subsequently formed, while the pFET device region 16 is another area in which pFET devices will be subsequently formed. As is known to those skilled in the art nFET devices have a different conductivity than pFET devices.

In some embodiments of the present application (not shown herein), the hard mask layer 12L is removed from atop the bulk silicon substrate 10 in the nFET device region 14, while maintaining the hard mask layer portion 12P on the pFET device region 16. In such an embodiment, the nFET device region will be processed to provide the structure shown in the nFET device region 14 of FIG. 10 of the present application. Also, and in this embodiment, the pFET device region 16 could include semiconductor fins that are made only from a remaining portion of the bulk silicon substrate.

Referring back to the embodiment depicted in FIG. 2, the hard mask layer 12L can be removed from the pFET device region 16 of the bulk silicon substrate 10 by lithography and etching. Lithography can include forming a photoresist (not shown) on the topmost surface of the hard mask layer 12L, exposing the photoresist to a desired pattern of radiation, and then developing the exposed photoresist with a resist developer to provide a patterned photoresist atop the material stack. An etch is then employed which transfers the pattern from the patterned photoresist into the hard mask layer 12L. In one embodiment, the etch used for pattern transfer may include a dry etch process such as, for example, reactive ion etching, plasma etching, ion beam etching or laser ablation. In another embodiment, the etch used for pattern transfer may include a wet chemical etchant. Typically, the etch that is employed is an anisotropic etch. After transferring the pattern into the hard mask layer 12L, the patterned photoresist can be removed utilizing a resist stripping process such as, for example, ashing.

Figure 3:
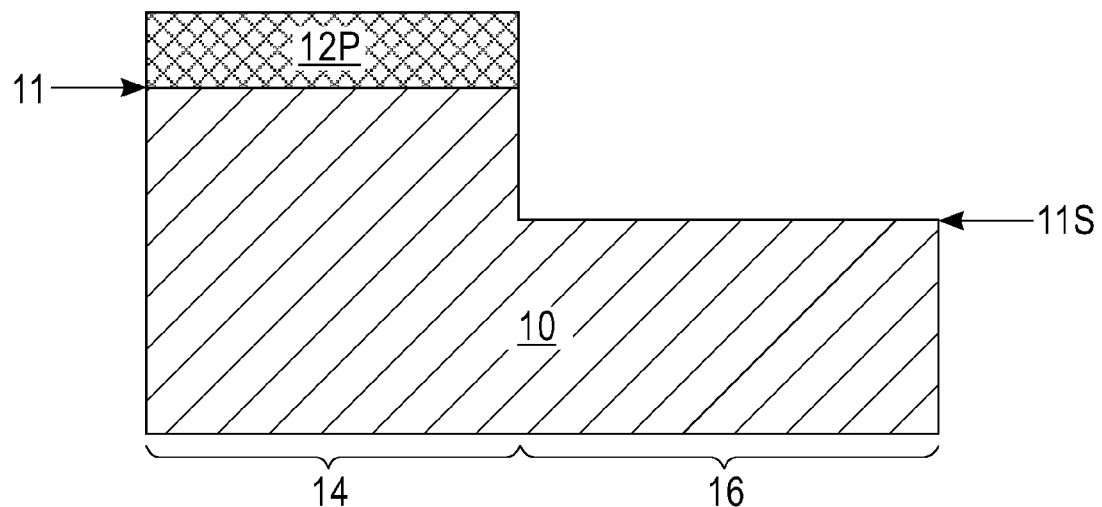
FIG. 3 is a cross sectional view of the exemplary semiconductor structure of FIG. 2 after recessing the bulk silicon substrate in the pFET device region to expose a sub-surface of the bulk silicon substrate.

Referring now to FIG. 3, there is illustrated the exemplary semiconductor structure of FIG. 2 after recessing the bulk silicon substrate 10 in the pFET device region 16 to expose a sub-surface 11S of the bulk silicon substrate 10. The term "sub-surface" as used in connection with the bulk silicon substrate 10 denotes a surface of the bulk silicon substrate 10 that is located beneath the original topmost surface 11 of the bulk silicon substrate 10. In one embodiment of the present application, the sub-surface 11S of the bulk silicon substrate 10 that is exposed in this step of the present application is located from 20 nm to 80 nm, with 30 nm to 60 nm more typical, below the original topmost surface of the bulk silicon substrate 10.

The recessing of the bulk silicon substrate 10 that is not protected by the hard mask layer portion 12P can be performed utilizing an etching process that is selective in removing semiconductor material as compared to the hard mask material that provides the hard mask layer portion 12P. In one embodiment of the present application, the recessing of the bulk silicon substrate 10 that is not protected by the hard mask layer portion 12P can be performed utilizing an anisotropic etching process. In one example, the anisotropic etch may include reactive ion etching (RIE).

Figure 4:
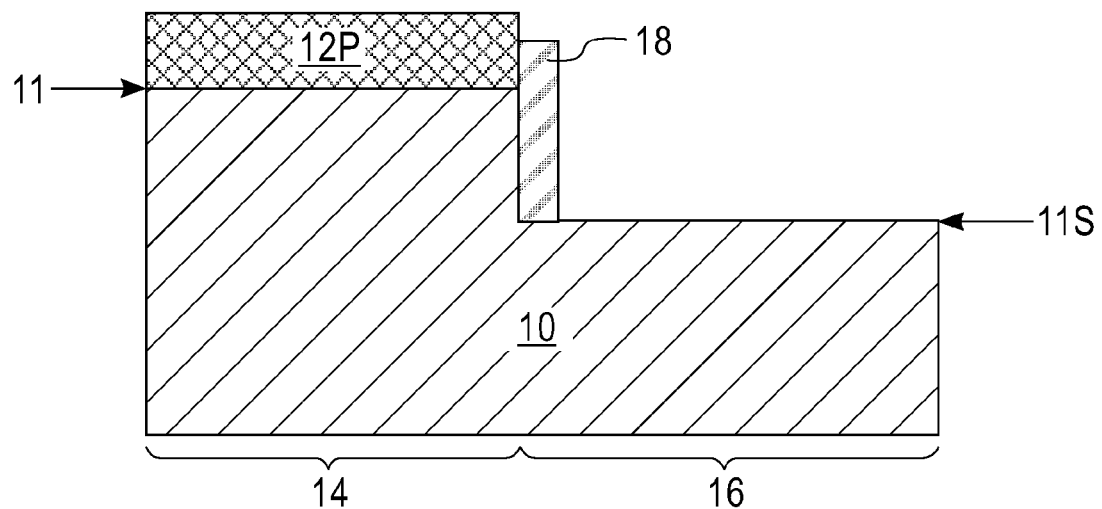
FIG. 4 is a cross sectional view of the exemplary semiconductor structure of FIG. 3 after forming an optional dielectric spacer having a base located on a portion of the sub-surface of the bulk silicon substrate in the pFET device region.

Referring now to FIG. 4, there is illustrated the exemplary semiconductor structure of FIG. 3 after forming a dielectric spacer 18 having a base located on a portion of the sub-surface 11S of the bulk silicon substrate 10 in the pFET device region 16. The dielectric spacer 18 also has an edge, i.e., sidewall, that is located on an exposed sidewall of the bulk silicon substrate 10 defined during the recessing step described above. In some embodiments of the present application, dielectric spacer 18 formation can be omitted and the process proceeds as described in FIG. 5.

In embodiments in which the dielectric spacer 18 is formed, the dielectric spacer 18 comprises any dielectric spacer material including, for example, a dielectric oxide, dielectric nitride, and/or dielectric oxynitride. In one example, the dielectric spacer material used in providing the dielectric spacer 18 may be composed of silicon dioxide or silicon nitride. In one embodiment of the present application, the dielectric spacer material that provides the dielectric spacer 18 comprises a same material as the hard mask material that provides the hard mask layer portion 12P. In another embodiment of the present application, the dielectric spacer material that provides the dielectric spacer 18 comprises a different material as the hard mask material that provides the hard mask layer portion 12P. The dielectric spacer material that provides the dielectric spacer 18 can be provided by a deposition process including, for example, chemical vapor deposition (CVD), plasma enhanced chemical vapor deposition (PECVD), or physical vapor deposition (PVD). Following the deposition of the dielectric spacer material, an etch such as, for example, a reactive ion etch, can be used to provide the dielectric spacer 18.

In some embodiments, and as shown, the dielectric spacer 18 that can be formed has a topmost surface that is located between the topmost surface of the hard mask layer portion 12P and the bottommost surface of the hard mask layer portion 12P. In another embodiment (not shown), the dielectric spacer 18 that can be formed has an topmost surface that is coplanar with either the topmost surface of the hard mask layer portion 12P or the bottommost surface of the hard mask layer portion 12P.

Figure 5:
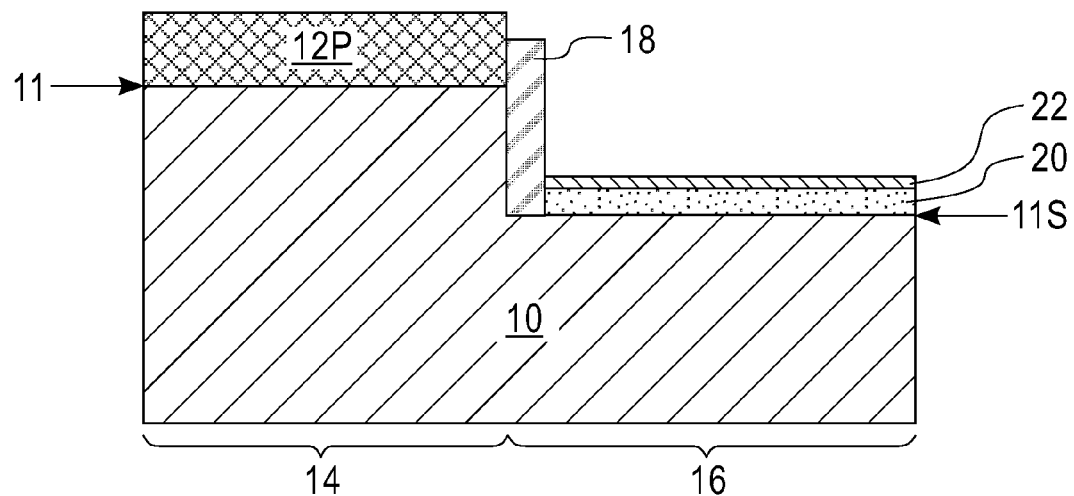
FIG. 5 is a cross sectional view of the exemplary semiconductor structure of FIG. 4 after forming an epitaxial semiconductor material stack of, from bottom to top, a first carbon-doped silicon layer containing at least one n-type dopant and a second carbon-doped silicon layer containing no further dopant on another portion of the sub-surface of the bulk silicon substrate.

Referring now FIG. 5, there is illustrated the exemplary semiconductor structure of FIG. 4 after forming an epitaxial semiconductor material stack of, from bottom to top, a first carbon-doped silicon layer 20 containing at least one n-type dopant and a second carbon-doped silicon layer 22 containing no further dopants. The term "carbon-doped silicon" can also be referred to herein as "silicon doped with carbon" or "Si:C" for short. It is noted that the dopant with the first carbon-doped silicon layer 20 must have an opposite conductivity as compared to the type of FET device being formed in the particular device region. Thus, and since a pFET device is formed within the pFET device region 16, the dopant within first carbon-doped silicon layer 20 must be an n-type dopant.

The epitaxial semiconductor stack (20, 22) can be formed utilizing an epitaxial growth, i.e., deposition process. The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Thus, in this instance, the first carbon-doped silicon layer 20 has an epitaxial relationship, i.e., same crystal orientation, with the sub-surface 11S of the bulk silicon substrate 10, while second carbon-doped silicon layer 22 has an epitaxial relationship with the underlying surface of the first carbon-doped silicon layer 20.

In some embodiments of the present application, the first and second carbon-doped silicon layers (20, 22) can be formed without breaking vacuum between the two epitaxial growth processes. In other embodiments of the present application, the vacuum may be broken between the two epitaxial growth processes that are used to provide the first and second carbon-doped silicon layers (20, 22) of the epitaxial material stack.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The first and second carbon-doped silicon layers (20, 22) can be formed utilizing a precursor gas mixture that can include a silicon source, a carbon source and a carrier gas. Examples of a silicon sources that can be employed include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of carbon sources that can be used include unsaturated hydrocarbons such as, for example, alkenes and alkynes containing from 2 to 16 carbon atoms. In addition, monomethylsilane is a commonly used gas for carbon doping in epitaxy, as such dimethylsilane, trimethylsilane, or tetramethyldisilane can be used in the present application as a carbon source. Carrier gases like hydrogen, nitrogen, helium and argon can be used.

As mentioned above, at least one n-type dopant is present in the first carbon-doped silicon layer 20. "N-type" refers to the addition of impurities that contributes free electrons to an intrinsic semiconductor. Examples of n-type dopants that can be present in the first carbon-doped silicon layer 20 include at least one element from Group VA of the Periodic Table of Elements. In particular, antimony, arsenic and phosphorus can be used as the at least one n-type dopant that can be present in the first carbon-doped silicon layer 20. In one embodiment, the first carbon-doped silicon layer 20 includes phosphorus as the n-type dopant. In the present application, the first carbon-doped silicon layer 20 serves as a pFET punch through stop layer.

In one embodiment of the present application, the at least one n-type dopant can be introduced during the epitaxial deposition that provides the first carbon-doped silicon layer 20 utilizing an in-situ doping epitaxial growth process. In such a process, an n-type dopant source gas is present in the gas mixture that provides a carbon-doped silicon layer.

In another embodiment of the present application, the at least one n-type dopant can be introduced after the epitaxial deposition that provides a carbon-doped silicon layer that contains no further dopant. In such an instance, at least one n-type dopant can be introduced in a previously epitaxial grown carbon-doped silicon layer utilizing one of ion implantation and gas phase doping.

In accordance with an embodiment of the present application, the first carbon-doped silicon layer 20 can contain a carbon concentration of from $1\times10^{19}$ atoms/cm$^3$ to $1\times10^{21}$ atoms/cm$^3$ and at least one n-type dopant in a concentration from $5\times10^{17}$ atoms/cm$^3$ to $4\times10^{20}$ atoms/cm$^3$. In accordance with another embodiment of the present application, the first carbon-doped silicon layer 20 can contain a carbon concentration of from $5\times10^{19}$ atoms/cm$^3$ to $5\times10^{20}$ atoms/cm$^3$ and at least one n-type dopant in a concentration from $1\times10^{18}$ atoms/cm$^3$ to $1\times10^{20}$ atoms/cm$^3$.

The first carbon-doped silicon layer 20 that is formed may have a thickness from 3 nm to 15 nm. Although thicknesses that are greater than or less than the aforementioned thickness range may also be used for the first carbon-doped silicon layer 20.

As mentioned above, no dopant (other than carbon) is present in the second carbon-doped silicon layer 22. That is, no n-type or p-type dopant is present in the second carbon-doped silicon layer 22 of the present application. Thus, no dopant is present during the epitaxial deposition of the second carbon-doped silicon layer 22 and no dopant is introduced into the second carbon-doped silicon layer 22 after the epitaxial deposition process. In the present application, the second carbon-doped silicon layer 22 serves as a diffusion barrier layer.

In accordance with an embodiment of the present application, the second carbon-doped silicon layer 22 can contain a carbon concentration of from $1\times10^{18}$ atoms/cm$^3$ to $5\times10^{20}$ atoms/cm$^3$. In accordance with another embodiment of the present application, the second carbon-doped silicon layer 22 can contain a carbon concentration of from $1\times10^{19}$ atoms/cm$^3$ to $1\times10^{20}$ atoms/cm$^3$.

The second carbon-doped silicon layer 22 that is formed may have a thickness from 2 nm to 10 nm. Although thicknesses that are greater than or less than the aforementioned thickness range may also be used for the second carbon-doped silicon layer 22.

In the embodiment illustrated in FIG. 5, the entirety of the first and second carbon-doped silicon layers (20, 22) is located beneath a topmost surface of the optional dielectric spacer 18. Also, the first carbon-doped silicon layer 20 has a bottommost surface that is coplanar with a bottommost surface of the dielectric spacer 18. Furthermore, sidewalls of both the first and second carbon-doped silicon layers (20, 22) are in direct physical contact with a sidewall portion of the dielectric spacer 18. In embodiments in which the dielectric spacer is omitted (not shown), sidewalls of the first and second carbon-doped silicon layers (20, 22) are in direct physical contact with a sidewall portion of bulk silicon substrate 10.

Figure 6:
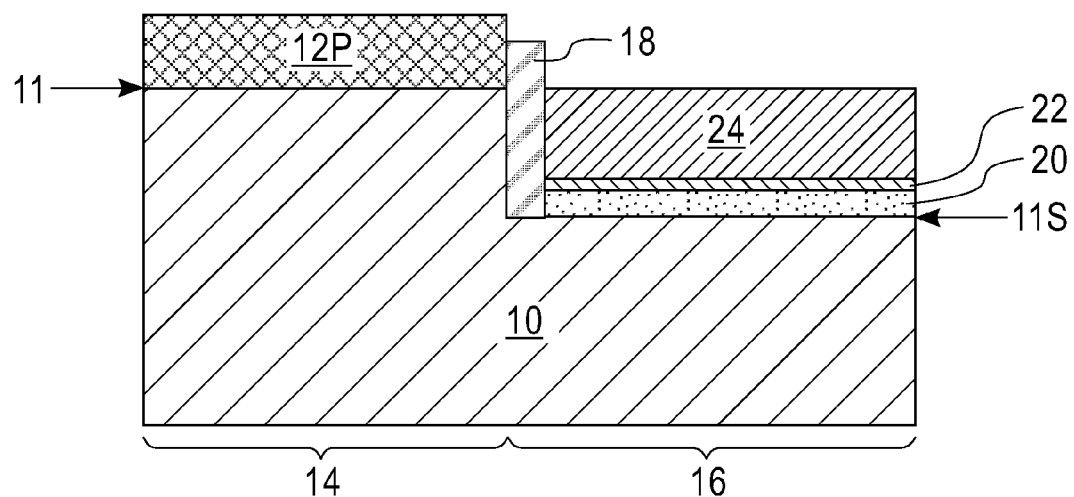
FIG. 6 is a cross sectional view of the exemplary semiconductor structure of FIG. 5 after forming an epitaxial semiconductor layer on a topmost surface of the epitaxial material stack to provide a pFET semiconductor material stack containing, from bottom to top, the first carbon-doped silicon layer, the second carbon-doped silicon layer and the epitaxial semiconductor layer.

Referring now to FIG. 6, there is illustrated the exemplary semiconductor structure of FIG. 5 after forming an epitaxial semiconductor layer 24 of silicon or a silicon germanium alloy on a topmost surface of the epitaxial material stack to provide a pFET semiconductor material stack containing, from bottom to top, the first carbon-doped silicon layer 20, the second carbon-doped silicon layer 22 and the epitaxial semiconductor layer 24. The formation of the epitaxial semiconductor layer 24 can be performed with or without breaking vacuum between the various depositions used in providing the first carbon-doped silicon layer 20, and the second carbon-doped silicon layer 22.

In one embodiment, the epitaxial semiconductor layer 24 comprises an epitaxial silicon layer. In such an embodiment, the epitaxial semiconductor layer 24 of silicon can be formed by utilizing one of the epitaxial deposition processes mentioned above. Since an epitaxial deposition process is used in forming the epitaxial semiconductor layer 24 of silicon, the epitaxial semiconductor layer 24 of silicon has an epitaxial relationship with the underlying second carbon-doped silicon layer 22. The conditions for epitaxial depositing the epitaxial semiconductor layer 24 of silicon are the same as mentioned above, except that no carbon source and other dopant is used in providing the epitaxial semiconductor layer 24 of silicon.

In one embodiment, the epitaxial semiconductor layer 24 comprises an epitaxial silicon germanium alloy layer. In such an embodiment, the epitaxial semiconductor layer 24 of silicon germanium alloy can be formed by utilizing one of the epitaxial deposition processes mentioned above. Since an epitaxial deposition process is used in forming the epitaxial semiconductor layer 24 of silicon germanium alloy, the epitaxial semiconductor layer 24 of silicon germanium alloy has an epitaxial relationship with the underlying second carbon-doped silicon layer 22. The conditions for epi-taxial depositing the epitaxial semiconductor layer 24 of silicon germanium alloy are the same as mentioned above, except that no carbon source and other dopant is used in providing the epitaxial semiconductor layer 24 of silicon germanium alloy. In some embodiments, the precursor gas used in forming silicon germanium alloy includes a combination of a silicon containing gas source and a germanium containing gas source. Examples of a silicon source include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of a germanium source include germane, digermane, halogermane, dichlorogermane, trichlorogermane, tetrachlorogermane and combinations thereof. In another embodiment, a single source containing both silicon and germanium atoms can be used in forming the silicon germanium alloy.

In one embodiment of the present application, the silicon germanium alloy that provides epitaxial semiconductor layer 24 can have a germanium content of from 20 atomic % to 50 atomic %.

In the embodiment illustrated in FIG. 6, the entirety of the epitaxial semiconductor layer 24 is located beneath a topmost surface of the optional dielectric spacer 18. Also, a sidewall of the epitaxial semiconductor layer 24 is in direct physical contact with a sidewall portion of the dielectric spacer 18. In embodiments in which the dielectric spacer is omitted (not shown), a sidewall of the epitaxial semiconductor layer 24 is in direct physical contact with a sidewall portion of bulk silicon substrate 10.

The epitaxial semiconductor layer 24 that is formed may have a thickness from 20 nm to 50 nm. Although thicknesses that are greater than or less than the aforementioned thickness range may also be used for the epitaxial semiconductor layer 24.

As shown in FIG. 6, the sidewalls of each of the first carbon-doped silicon layer 20, the second carbon-doped silicon layer 22 and the epitaxial semiconductor layer 24 are vertically coincident with each other.

Figure 7:
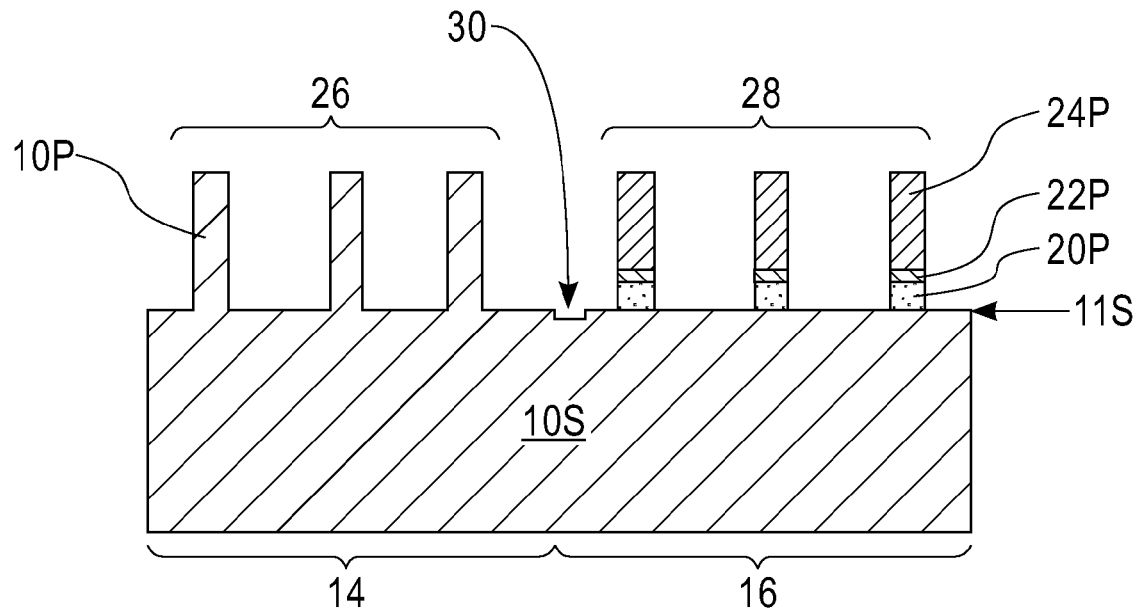
FIG. 7 is a cross sectional view of the exemplary semiconductor structure of FIG. 6 after forming a plurality of first fins in a portion of the bulk silicon substrate and in the nFET device region, and forming a plurality of second semiconductor fins in a portion of the pFET semiconductor material stack and in the pFET device region.

Referring now to FIG. 7, there is illustrated the exemplary semiconductor structure of FIG. 6 after forming a plurality of first semiconductor fins 26 in a portion of the bulk silicon substrate 10 and in the nFET device region 14, and forming a plurality of second semiconductor fins 28 in a portion of the pFET semiconductor material stack (20, 22 and 24) and in the pFET device region 16.

The plurality of first semiconductor fins 26 and the plurality of second semiconductor fins 28 can be defined by a patterning process. In some embodiments (as shown) and prior to patterning, the hard mask layer portion 12P can be removed utilizing a material removal process such as, for example, chemical mechanical planarization. In some embodiments (not shown), the hard mask layer portion 12P is not removed prior to patterning, and in such an embodiment, a hard mask cap may be present atop the semiconductor fins that are formed in the area containing the hard mask layer portion 12P.

In one embodiment, the patterning process used to define the semiconductor fins includes a sidewall image transfer (SIT) process. The SIT process includes forming a contiguous mandrel material layer (not shown) on the topmost surface of structure. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each silicon fin.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor materials that provides the plurality of first semiconductor fins 26 and the plurality of second semiconductor fins 28. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process. In some embodiments, lithography and etching can be used to define the plurality of first semiconductor fins 26 and the plurality of second semiconductor fins 28.

During the patterning process, the dielectric spacer 18 can be removed, and in some instances, a portion of the bulk silicon substrate 10 directly beneath the dielectric spacer 18 can be removed forming a recessed area 30 in the remaining bulk silicon substrate.

As used herein, a "fin" refers to a contiguous structure including at least one semiconductor material and including a pair of vertical sidewalls that are parallel to each other. As used herein, a surface is "vertical" if there exists a vertical plane from which the surface does not deviate by more than three times the root mean square roughness of the surface.

Each first semiconductor fin of the plurality of first semiconductor fins 26 includes a silicon portion 10P. Silicon portion 10P is comprised on the same semiconductor material as the bulk silicon substrate 10 and thus there is no material interface between the silicon portion 10P and the remaining portion of the bulk silicon substrate 10s.

Each second semiconductor fin of the plurality of second semiconductor fins 28 includes, from bottom to top, a remaining portion of the first carbon-doped silicon layer 20, a remaining portion of the second carbon-doped silicon layer 22 and a remaining portion of the epitaxial semiconductor layer 24. The remaining portion of the first carbon-doped silicon layer 20 can now be referred to as first carbon-doped silicon portion 20P. The remaining portion of the second carbon-doped silicon layer 22 can now be referred to as second carbon-doped silicon portion 22P. The remaining portion of the epitaxial semiconductor layer 24 can now be referred to herein as epitaxial semiconductor portion 24P.

As is shown, sidewalls of the first carbon-doped silicon portion 20P, the second carbon-doped silicon portion 22P, and the epitaxial semiconductor portion 24P are vertically coincident with each other. It is noted that in the present application, the first carbon-doped silicon portion 20P and the second carbon-doped silicon portion 22P completely isolate a bottommost surface of the epitaxial semiconductor portion 24P from the remaining portion of the bulk silicon substrate 10S (10S may also be referred to herein as bulk silicon substrate portion).

Each first semiconductor fin of the plurality of first semiconductor fins 26 and each second semiconductor fin of the plurality of second semiconductor fins 28 has a height from 10 nm to 100 nm, and a width from 4 nm to 30 nm. In another embodiment of the present application, first semiconductor fin of the plurality of first semiconductor fins 26 and each second semiconductor fin of the plurality of second semiconductor fins 28 has a height from 15 nm to 50 nm, and a width from 5 nm to 12 nm. Also, each first semiconductor fin of the plurality of first semiconductor fins 26 and each second semiconductor fin of the plurality of second semiconductor fins 28 is oriented parallel to each other. Further, and in the embodiment illustrated, a topmost surface of each first semiconductor fin of the plurality of first semiconductor fins 26 is coplanar with a topmost surface of each second semiconductor fin of the plurality of second semiconductor fins 28.

Figure 8:
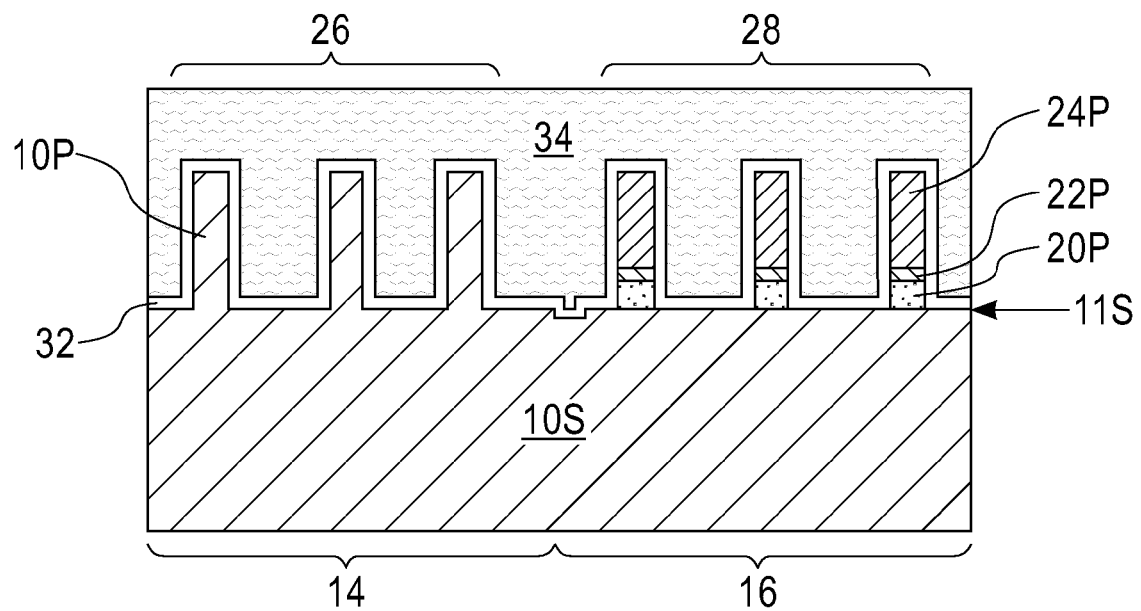
FIG. 8 is a cross sectional view of the semiconductor structure of FIG. 7 after forming a functional gate structure straddling each of the first semiconductor fins and each of the second semiconductor fins.

Referring now to FIG. 8, there is illustrated the semiconductor structure of FIG. 7 after forming a functional gate structure (32, 34) straddling each of the first semiconductor fins 26 and each of the second semiconductor fins 28. By "straddling" it is meant that the functional gate structure is located directly above a topmost surface of the semiconductor fin as well as adjacent two vertical sidewalls of the semiconductor fin. The term "functional gate structure" is used throughout the present application as a permanent gate structure used to control output current (i.e., flow of carriers in the channel) of a semiconducting device through electrical or magnetic fields. The functional gate structure (32, 34) can be formed utilizing a gate first process or a gate last process.

In a gate first process, at least one functional gate structure is formed prior to forming the source and drain regions. The at least one functional gate structure can be formed by deposition of a gate material stack and then patterning the gate material stack by lithography and etching.

The at least one functional gate structure includes a gate dielectric material portion 32 and a gate conductor portion 34. While the embodiment that is illustrated discloses that the gate dielectric material portion 32 and the gate conductor portion 34 are the same in the nFET device region 14 and the pFET device region 16, it is also possible to form a gate dielectric material portion and/or a gate electrode portion in the nFET device region that is different from the gate dielectric material portion and/or the gate electrode portion in the pFET device region. In such embodiments, conventional block mask technology can be used in forming the different gate dielectric material portion and/or different gate electrode portion in each of the device regions.

In the embodiment illustrated in the drawings, the gate dielectric portion 32 is present on three surfaces (i.e., the two vertical sidewalls and the topmost surface) of each first semiconductor fin of the plurality of first semiconductor fins 26 and three surfaces of each second semiconductor fin of the plurality of second semiconductor fins 28 (i.e., the two vertical sidewalls and the topmost surface). In other embodiments, and when a hard mask cap is present, the gate dielectric portion is located only on the two vertically sidewalls of the semiconductor fins.

The gate dielectric material portion 32 includes any gate dielectric material. In one embodiment, the gate dielectric material that provides the gate dielectric material portion 32 can be a semiconductor oxide, a semiconductor nitride, and/or a semiconductor oxynitride. In one example, the gate dielectric material that provides each gate dielectric material portion 32 can be composed of silicon dioxide, silicon nitride and/or silicon oxynitride. In another embodiment of the present application, the gate dielectric material that provides the gate dielectric material portion 32 may include at least a dielectric metal oxide. Exemplary dielectric metal oxides that can be used as the gate dielectric material that provides the gate dielectric material portion 32 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides the gate dielectric material portion 32.

In some embodiments of the present application, the gate dielectric material that provides the gate dielectric material portion 32 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the gate dielectric material portion 32 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material that provides the gate dielectric material portion 32 can have a thickness in a range from 1 nm to 10 nm. Other thicknesses that are lesser than or greater than the aforementioned thickness range can also be employed for the gate dielectric material that provides the gate dielectric material portion 32.

The gate conductor portion 34 may comprise any conductive material. Examples of conductive materials that can provide each gate conductor portion 34 include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the conductive material that provides the gate conductor portion 34 is comprised of a doped polysilicon or doped polysilicon germanium. In another embodiment, a lower portion of the conductive material that provides the gate conductor portion 34 is comprised a conductive material other than doped polysilicon or doped polysilicon germanium, and an upper portion of the conductive material that provides the gate conductor portion 34 is comprised of doped polysilicon or doped silicon germanium.

The conductive material that provides the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides the gate conductor portion 34 has a thickness from 1 nm to 100 nm. Other thicknesses that are lesser than or greater than the aforementioned thickness range can also be employed for the conductive material that provides the gate conductor portion 34.

As mentioned above, the functional gate structure can be formed by first providing a material stack of, from bottom to top, a gate dielectric material and a conductive material. In some embodiments, block mask technology may be used to form different gate dielectric materials and/or conductive materials within the various device regions. Following the formation of the material stack, the material stack can be patterned by lithography and etching. Lithography can include forming a photoresist (not shown) on the topmost surface of the conductive material of the material stack, exposing the photoresist to a desired pattern of radiation, and then developing the exposed photoresist with a resist developer to provide a patterned photoresist atop the material stack. At least one etch is then employed which transfers the pattern from the patterned photoresist into the various materials of the material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing. After patterning the gate material stack, a functional gate structure including gate dielectric material portion 32 and a gate conductor portion 34 is formed.

At this point of the present application, conventional processing can be used to form a dielectric spacer on the exposed sidewalls of the functional gate structure, and thereafter dopants can be introduced into portions of each first semiconductor fin 26 and second semiconductor fin 28 not including the functional gate structure and dielectric spacer utilizing techniques that are well known to those skilled in the art to form the source regions and the drain regions of each finFET device. The source regions in each various device region may then be merged utilizing an epitaxial growth process.

In some embodiments, a gate last process (not specifically shown) can be used in forming the at least one functional gate structure. In such an embodiment, a sacrificial gate structure (not shown) is first formed straddling each semiconductor fin within the various device regions. The term "sacrificial gate structure" is used throughout the present application to denote a material that serves as a placeholder structure for a functional gate structure to be subsequently formed.

The sacrificial gate structure can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structures.

Next, a dielectric spacer can be optionally formed on sidewalls of each sacrificial gate structure. The source and drain regions (and the corresponding extension regions) can be formed after formation of the either the sacrificial gate structure or spacer formation. Next, a dielectric material is provided that has an upper surface that is planar to each sacrificial gate structure. Then, each sacrificial gate structure can be replaced with a functional gate structure as defined above.

Figure 9:
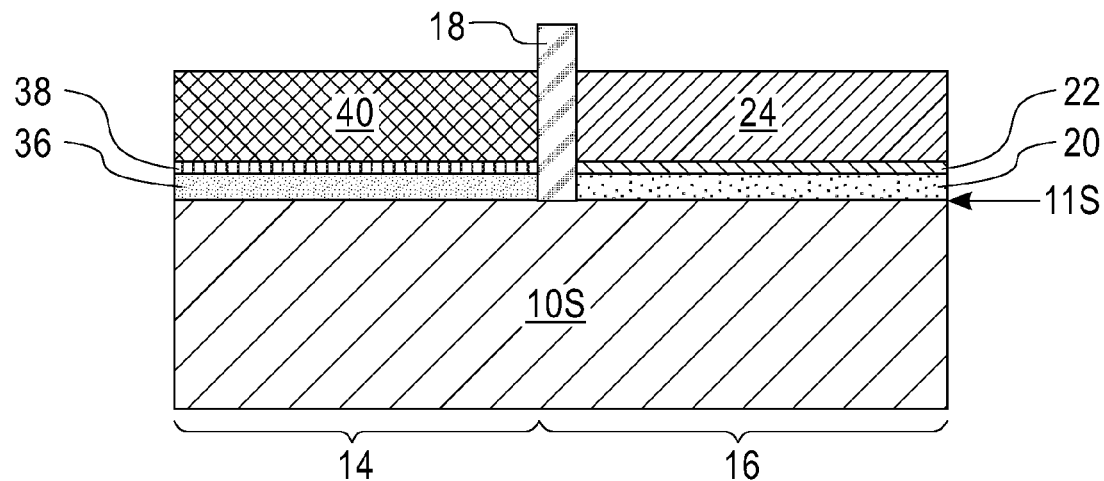
FIG. 9 is a cross sectional view of the semiconductor structure of FIG. 6 after recessing the bulk silicon substrate in the nFET device region, and then forming an nFET semiconductor material stack containing, from bottom to top, a first silicon germanium alloy layer containing at least one p-type dopant, a second silicon germanium alloy layer containing no further dopants and another epitaxial semiconductor layer in accordance with another embodiment of the present application.

Referring now to FIG. 9, there is illustrated the semiconductor structure of FIG. 6 after recessing the bulk silicon substrate 10 in the nFET device region 14, and then forming an nFET semiconductor material stack containing, from bottom to top, a first silicon germanium alloy layer 36 containing at least one p-type dopant (functions as a punch through stop layer), a second silicon germanium alloy layer 38 containing no further dopants (functions as a diffusion barrier layer) and another epitaxial semiconductor layer 40 in accordance with another embodiment of the present application. It is noted that the dopant with the first silicon germanium alloy layer 36 must have an opposite conductivity as compared to the type of FET device being formed in the particular device region. Thus, and since an nFET device is formed within the nFET device region 14, the dopant within first silicon germanium alloy layer 36 must be an p-type dopant.

The recessing of the bulk silicon substrate 10 in the nFET device region 14 is the same as that mentioned above for recessing the bulk silicon substrate 10 in the pFET device region 16. The recess within the nFET device region exposes another sub-surface of the bulk silicon substrate 10. In the embodiment illustrated, the another sub-surface that is exposed in the nFET device region 14 is coplanar with the sub-surface 11S that was previously exposed in the pFET device region 16. Embodiments are possible in which the another sub-surface that is exposed in the nFET device region 14 is higher or lower than the sub-surface 11S that was previously exposed in the pFET device region 16.

After exposing the another sub-surface of the bulk silicon substrate 10 in the nFET device region 14, the first silicon germanium alloy layer 36, the second silicon germanium alloy layer 38, and the another epitaxial semiconductor layer 40 are formed by epitaxial deposition. In this embodiment of the present application, the first silicon germanium alloy layer 36 has an epitaxial relationship with the another sub-surface of the bulk silicon substrate 10, the second silicon germanium alloy layer 38 has an epitaxial relationship with the first silicon germanium alloy layer 36, and the another epitaxial semiconductor layer 40 has an epitaxial relationship with the second silicon germanium alloy layer 38.

The epitaxial deposition processes and conditions used in forming the various semiconductor materials of the nFET semiconductor material stack are the same as those described above in forming the various semiconductor materials of the pFET semiconductor material stack.

In one embodiment, the first and second silicon germanium alloy layers (36, 38) can be formed utilizing a precursor gas mixture that can include a silicon source, a germanium source and a carrier gas as mentioned above in forming the epitaxial semiconductor layer 24 of silicon germanium alloy. In another embodiment, the first and second silicon germanium alloy layers (36, 38) can be formed utilizing a precursor gas mixture that includes a combined silicon and germanium source and a carrier gas.

As mentioned above, at least one p-type dopant is present in the first silicon germanium alloy layer 36. "P-type" refers to the addition of impurities to an intrinsic semiconductor that creates deficiencies of valence electrons. Examples of p-type dopants, i.e., impurities, include, an element from Group IIIA of the Periodic Table of Elements. For example, one of boron, aluminum, gallium and indium may be used as the p-type dopant that can be present in the first silicon germanium alloy layer 36. Typically, the p-type dopant that is present in the first silicon germanium alloy layer 36 is boron. In the present application, the first silicon germanium alloy layer 36 serves as an nFET punch through stop layer.

In one embodiment of the present application, the at least one p-type dopant can be introduced during the epitaxial deposition that provides the first silicon germanium alloy layer 36 utilizing an in-situ doping epitaxial growth process. In such a process, a p-type dopant source gas is present in the gas mixture that provides a silicon germanium alloy layer.

In another embodiment of the present application, the at least one p-type dopant can be introduced after the epitaxial deposition that provides a silicon germanium alloy that contains no further dopant. In such an instance, the at least one p-type dopant can be introduced in a previously epitaxial grown silicon germanium alloy layer utilizing one of ion implantation and gas phase doping.

In accordance with an embodiment of the present application, the first silicon germanium alloy layer 36 can contain a germanium concentration of from 5 atomic % to 40 atomic % and at least one p-type dopant in a concentration from $1 \times 10^{18}$ atoms/cm$^3$ to $1 \times 10^{19}$ atoms/cm$^3$. In accordance with another embodiment of the present application, the first silicon germanium alloy layer 36 can contain a germanium concentration of from 20 atomic % to 30 atomic % and at least one p-type dopant in a concentration from $1 \times 10^{19}$ atoms/cm$^3$ to $2 \times 10^{20}$ atoms/cm$^3$.

The first silicon germanium alloy layer 36 that is formed may have a thickness from 3 nm to 15 nm. Although thicknesses that are greater than or less than the aforementioned thickness range may also be used for the first silicon germanium alloy layer 36.

As further mentioned above, no dopant is present in the second silicon germanium alloy layer 38. That is, no n-type or p-type dopant is present in the second silicon germanium alloy layer 38 of the present application. Thus, no dopant is present during the epitaxial deposition of the second silicon germanium alloy layer 38 and no dopant is introduced into the second silicon germanium alloy layer 38 after the epitaxial deposition process. In the present application, the second silicon germanium alloy layer 38 serves as a diffusion barrier layer.

The second silicon germanium alloy layer 38 can contain a germanium concentration in the range mentioned above for the first silicon germanium alloy layer 36.

The second silicon germanium alloy layer 38 that is formed may have a thickness from 2 nm to 10 nm. Although thicknesses that are greater than or less than the aforementioned thickness range may also be used for the second silicon germanium alloy layer 38.

In the embodiment illustrated in FIG. 9, the entirety of the first and second silicon germanium alloy layers (36, 38) is located beneath a topmost surface of the optional dielectric spacer 18. Also, the first silicon germanium alloy layer 36 has a bottommost surface that is coplanar with a bottommost surface of the dielectric spacer 18. Furthermore, sidewalls of both the first and second silicon germanium alloy layers (36, 38) are in direct physical contact with a sidewall portion of the dielectric spacer 18. In embodiments in which the dielectric spacer is omitted (not shown), sidewalls of the first and second silicon germanium alloy layers (36, 38) are in direct physical contact with a sidewall portion of bulk silicon substrate 10.

Next, the another epitaxial semiconductor layer 40 is formed atop the second silicon germanium alloy layer 38 by epitaxial deposition. Another epitaxial semiconductor layer 40 can be formed as described above in forming the epitaxial semiconductor layer 24. The another semiconductor layer 40 is typically comprised of silicon.

In the embodiment illustrated, the nFET semiconductor material stack (36, 38 and 40) has a topmost surface that coplanar with a topmost surface of the pFET semiconductor material stack (20, 22 and 24). In some other embodiments, the topmost surface of the nFET semiconductor material stack (36, 38 and 40) can be above or below the topmost surface of the pFET semiconductor material stack (20, 22 and 24).

Figure 10:
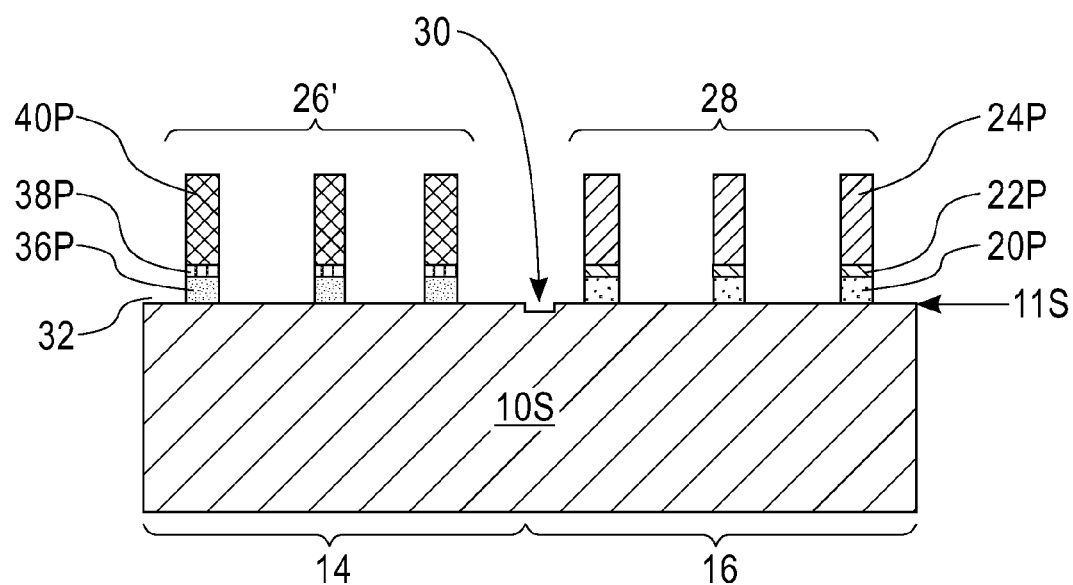
FIG. 10 is a cross sectional view of the exemplary semiconductor structure of FIG. 9 after forming a plurality of first semiconductor fins in a portion of the nFET semiconductor material stack and in the nFET device region, and forming a plurality of second semiconductor fins in a portion of the pFET semiconductor material stack and in the pFET device region.

Referring now to FIG. 10, there is illustrated the exemplary semiconductor structure of FIG. 9 after forming a plurality of first semiconductor fins 26' in a portion of the nFET semiconductor material stack (36, 38 and 40) and in the nFET device region 14, and forming a plurality of second semiconductor fins 28 in a portion of the pFET semiconductor material stack (20, 22 and 24) and in the pFET device region 16. The plurality of first semiconductor fins 26' and the plurality of second semiconductor fins 28 can be formed as described above in forming the various semiconductor fins shown in FIG. 7 of the present application.

Each first semiconductor fin of the plurality of first semiconductor fins 26' includes, from bottom to top, a remaining portion of the first silicon germanium alloy layer 36, a remaining portion of the second silicon germanium alloy layer 38 and a remaining portion of the another epitaxial semiconductor layer 40. The remaining portion of the first silicon germanium alloy layer 36 can now be referred to as first silicon germanium alloy portion 36P. The remaining portion of the second silicon germanium alloy layer 38 can now be referred to as second silicon germanium alloy portion 38P. The remaining portion of the another epitaxial semiconductor layer 40 can now be referred to herein as another epitaxial semiconductor portion 40P.

As is shown, sidewalls of the first silicon germanium alloy portion 36P, the second silicon germanium alloy portion 38P, and the another epitaxial semiconductor portion 40P are vertically coincident with each other. It is noted that in the present application, the first silicon germanium alloy portion 36P and the second silicon germanium alloy portion 38P completely isolate a bottommost surface of the another epitaxial semiconductor portion 40P the remaining portion of the bulk silicon substrate 10S (10S may also be referred to herein as bulk silicon substrate portion).

Each second semiconductor fin of the plurality of second semiconductor fins 28 includes, from bottom to top, a remaining portion of the first carbon-doped silicon layer 20, a remaining portion of the second carbon-doped silicon layer 22 and a remaining portion of the epitaxial semiconductor layer 24. The remaining portion of the first carbon-doped silicon layer 20 can now be referred to as first carbon-doped silicon portion 20P. The remaining portion of the second carbon-doped silicon layer 22 can now be referred to as second carbon-doped silicon portion 22P. The remaining portion of the epitaxial semiconductor layer 24 can now be referred to herein as epitaxial semiconductor portion 24P. In some embodiments (not shown), the each second semiconductor fin may comprise a remaining portion of the bulk silicon substrate; such an embodiment occurs when a hard mask is present over the pFET device region 16, and no recessing in the pFET device region of the bulk silicon substrate 10 occurs.

As is shown, sidewalls of the first carbon-doped silicon portion 20P, the second carbon-doped silicon portion 22P, and the epitaxial semiconductor portion 24P are vertically coincident with each other. It is noted that in the present application, the first carbon-doped silicon portion 20P and the second carbon-doped silicon portion 22P completely isolate a bottommost surface of the epitaxial semiconductor portion 24P from the remaining portion of the bulk silicon substrate 10S (10S may also be referred to herein as bulk silicon substrate portion).

Each first semiconductor fin of the plurality of first semiconductor fins 26' and each second semiconductor fin of the plurality of second semiconductor fins 28 has a height from 10 nm to 100 nm, and a width from 4 nm to 30 nm. In another embodiment of the present application, first semiconductor fin of the plurality of first semiconductor fins 26' and each second semiconductor fin of the plurality of second semiconductor fins 28 has a height from 15 nm to 50 nm, and a width from 5 nm to 12 nm. Also, each first semiconductor fin of the plurality of first semiconductor fins 26' and each second semiconductor fin of the plurality of second semiconductor fins 28 is oriented parallel to each other. Further, and in the embodiment illustrated, a topmost surface of each first semiconductor fin of the plurality of first semiconductor fins 26' is coplanar with a topmost surface of each second semiconductor fin of the plurality of second semiconductor fins 28.

Figure 11:
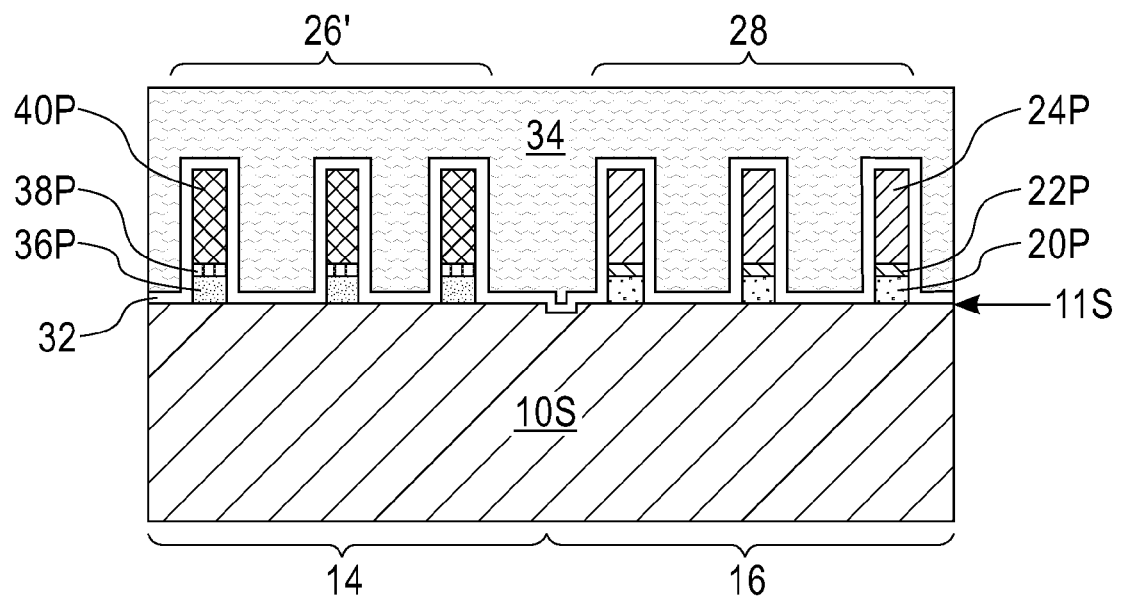
FIG. 11 is a cross sectional view of the exemplary semiconductor structure of FIG. 10 after forming a functional gate structure straddling each of the first semiconductor fins and each of the second semiconductor fins.

Referring now to FIG. 11, there is illustrated the exemplary semiconductor structure of FIG. 10 after forming a functional gate structure (32, 34) straddling each of the first semiconductor fins 26' and each of the second semiconductor fins 28. The functional gate structure of this embodiment of the present application can be formed utilizing a gate first or gate last process as mentioned above in providing the functional gate structure shown in FIG. 8. The functional gate structure of this embodiment also includes a gate dielectric material portion 32 and a gate conductor material portion 34 as defined above in providing the gate dielectric material portion 32 and the gate conductor material portion 34 to the structure shown in FIG. 8.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a bulk silicon substrate comprising a device region for a p-type semiconductor device of a first conductivity type;
   recessing an exposed portion of said bulk silicon substrate in said device region to expose a sub-surface of said bulk silicon substrate;
   forming a semiconductor material stack of, from bottom to top, a semiconductor punch through stop layer containing at least one dopant of a second conductivity type which is opposite from said first conductivity type, a semiconductor diffusion barrier layer containing no n- or p-type dopant, and an epitaxial semiconductor layer on said sub-surface of said bulk silicon substrate; and
   forming a plurality of semiconductor fins in said device region, wherein each semiconductor fin of said plurality of semiconductor fins comprises, from bottom to top, a remaining portion of said semiconductor punch through stop layer, a remaining portion of said semiconductor diffusion barrier, and a remaining portion of said epitaxial semiconductor layer, wherein said semiconductor punch through stop layer comprises a first carbon-doped silicon layer, said semiconductor diffusion barrier layer comprises a second carbon-doped silicon layer, and said epitaxial semiconductor layer comprises silicon or a silicon germanium alloy.

2. The method of claim 1, wherein said forming said semiconductor stack comprises epitaxially growing said semiconductor punch through stop layer over said sub-surface of said bulk silicon substrate, and epitaxially growing said semiconductor diffusion barrier layer over said semiconductor punch through stop layer.

3. The method of claim 1, further comprising another device region located adjacent to said device region for said semiconductor device of said first conductivity type, wherein said another device region is for another semiconductor device having said second conductivity type, and wherein a hard mask layer portion is present on said another device region during said recessing.

4. The method of claim 3, further comprising forming a dielectric spacer having a base located on said sub-surface of said bulk silicon substrate in said device region, wherein a topmost surface of said dielectric spacer is located between topmost surface of said hard mask layer portion and bottommost surface of said hard mask layer portion present on said another device region.

5. The method of claim 4, wherein a bottommost surface of said semiconductor punch through stop layer in said device region is coplanar with a bottommost surface of said dielectric spacer.

6. The method of claim 3, further comprising removing said hard mask layer portion in said another device region, after said recessing and prior to said forming said plurality of semiconductor fins in said device region, and forming a plurality of other semiconductor fins in said another device region simultaneously with said forming said plurality of semiconductor fins in said device region.

7. The method of claim 6, further comprising recessing said bulk silicon substrate in said another device region to expose another sub-surface of said bulk silicon substrate in said another device region, and forming another semiconductor material stack on said another sub-surface of said bulk silicon substrate in said another device region, said recessing of said bulk silicon substrate being performed subsequent to said removing of said hard mask layer and prior to forming of said plurality of semiconductor fins and said plurality of said other semiconductor fins.

8. The method of claim 7, wherein a topmost surface of said sub-surface of said bulk silicon substrate in said device region is coplanar with said topmost surface of said another sub-surface of said bulk silicon substrate in said another device region.

9. The method of claim 6, wherein each of said other semiconductor fins of said plurality of other semiconductor fins in said another device region comprises, from bottom to top, a first silicon germanium alloy portion containing at least one dopant of said first conductivity type, a second silicon germanium alloy portion containing no further dopant, and an epitaxial semiconductor portion.

10. The method of claim 6, wherein said dielectric spacer is removed during forming of said plurality of semiconductor fins in said device region and forming of said plurality of other semiconductor fins in said another device region.

11. The method of claim 10, wherein a recessed area is present in a remaining portion of said bulk silicon substrate, subsequent to said removal of said dielectric spacer.

12. The method of claim 3, wherein said plurality of other semiconductor fins comprises a silicon portion of said bulk silicon substrate.

13. A semiconductor structure comprising:
a bulk silicon substrate portion comprising a device region for a p-type semiconductor device of a first conductivity type; and
a plurality of semiconductor fins in said device region and extending upward from said bulk silicon substrate portion, wherein each semiconductor fin of said plurality of semiconductor fins comprises, from bottom to top, a semiconductor punch through stop portion containing a dopant of the second conductivity type that is opposite from said first conductivity type, a semiconductor diffusion barrier portion containing no n- or p-type dopant, and an epitaxial semiconductor portion, wherein said semiconductor punch through stop portion comprises a first carbon-doped silicon portion, said semiconductor diffusion barrier portion comprises a second carbon-doped silicon portion, and said epitaxial semiconductor portion comprises silicon or a silicon germanium alloy.

14. The semiconductor structure of claim 13, further comprising another device region located adjacent to said device region for said semiconductor device of said first conductivity type, wherein said another device region is for another semiconductor device having said second conductivity type.

15. The semiconductor structure of claim 14, further comprising a plurality of other semiconductor fins in said another device region, wherein each semiconductor fin of said plurality of other semiconductor fins comprises a silicon portion in direct physical contact with topmost surface of said bulk silicon substrate portion.

16. The semiconductor structure of claim 14, further comprising a functional gate structure straddling over a portion of each semiconductor fin of said plurality of semiconductor fins, and straddling over a portion of said plurality of other semiconductor fins.

17. The semiconductor structure of claim 14, wherein topmost surface of each semiconductor fin of said plurality of semiconductor fins is coplanar with a topmost surface each semiconductor fin of said plurality of other semiconductor fins.

18. The semiconductor structure of claim 14, wherein a topmost surface of said sub-surface of said bulk silicon substrate in said device region is coplanar with said topmost surface of an another sub-surface of said bulk silicon substrate in said another device region.

* * * * *